(12) United States Patent
Alemán et al.

(10) Patent No.: US 10,879,445 B2
(45) Date of Patent: Dec. 29, 2020

(54) DETERMINISTIC QUANTUM EMITTER FORMATION IN HEXAGONAL BORON NITRIDE VIA CONTROLLED EDGE CREATION

(71) Applicant: University of Oregon, Eugene, OR (US)

(72) Inventors: Benjamín J. Alemán, Eugene, OR (US); Joshua E. Ziegler, Eugene, OR (US)

(73) Assignee: University of Oregon, Eugene, OR (US)

( * ) Notice: Subject to any disclaimer, the term of this patent is extended or adjusted under 35 U.S.C. 154(b) by 0 days.

(21) Appl. No.: 16/788,685

(22) Filed: Feb. 12, 2020

(65) Prior Publication Data

US 2020/0259065 A1    Aug. 13, 2020

Related U.S. Application Data

(60) Provisional application No. 62/804,535, filed on Feb. 12, 2019.

(51) Int. Cl.
| | |
|---|---|
| *H01L 39/12* | (2006.01) |
| *G06N 10/00* | (2019.01) |
| *H04B 10/70* | (2013.01) |
| *H04B 10/291* | (2013.01) |

(52) U.S. Cl.
CPC .............. *H01L 39/12* (2013.01); *G06N 10/00* (2019.01); *H04B 10/291* (2013.01); *H04B 10/70* (2013.01)

(58) Field of Classification Search
CPC ........ H01L 39/12; G06N 10/00; H04B 10/70; H04B 10/291

USPC ...................................................... 250/493.1
See application file for complete search history.

(56) References Cited

U.S. PATENT DOCUMENTS

2019/0288160 A1* 9/2019 Atature ............... H01L 33/0075

OTHER PUBLICATIONS

Proscia, et al., Near-Deterministic Activation of Room Temperature Quantum Emitters in Hexagonal Boron Nitride. Optica 2017, 5, 1128-1134.
Chejanovsky, et al., Quantum Light in Curved Low Dimensional Hexagonal Boron Nitride Systems. Sci. Rep. 2017, 7, 1-14.
Choi, et al., Engineering and Localization of Quantum Emitters in Large Hexagonal Boron Nitride Layers. ACS Appl. Mater. Interfaces 2016, 8, 29642-29648.
Chejanovsky, et al. Structural Attributes and Photodynamics of Visible Spectrum Quantum Emitters in Hexagonal Boron Nitride. Nano Lett. 2016, 16, 7037-7045.
Aharonovich, et al., Solid-State Single-Photon Emitters. Nat. Photonics 2016, 10, 631-641.
(Continued)

*Primary Examiner* — Michael Maskell
(74) *Attorney, Agent, or Firm* — Lumen Patent Firm

(57) ABSTRACT

A quantum emitter device is composed of a hole milled in a layer of hexagonal boron nitride (hBN) on a substrate made of silicon dioxide. The hole preferably has a side wall angle 1.1°±0.28° from the horizontal, has an oval shape with minor axis 516 nm±20 nm and major axis 600 nm±20 nm, and/or has a depth 4 nm±1 nm. The hBN layer preferably has a total thickness of 5-10 nm. The holes may be fabricated using a gallium focused ion beam, a helium focused ion beam, electron beam directed etching, or photolithography and reactive ion etch (RIE) with sidewall tapering.

13 Claims, 13 Drawing Sheets

(56) References Cited

OTHER PUBLICATIONS

Tran, et al., Quantum Emission From Hexagonal Boron Nitride Monolayers. Nat. Nanotechnol. 2015, 11, 37-42.
Tran, et al., Robust Multicolor Single Photon Emission from Point Defects in Hexagonal Boron Nitride. ACS Nano 2016, 10, 7331-7338.
Jungwirth, et al., Temperature Dependence of Wavelength Selectable Zero-Phonon Emission from Single Defects in Hexagonal Boron Nitride. Nano Lett. 2016, 16, 6052-6057.
Grosso, et al., Tunable and High Purity Room-Temperature Single Photon Emission from Atomic Defects in Hexagonal Boron Nitride. Nat. Commun. 2016, 8, 1-8.
Martínez, et al., Efficient Single Photon Emission from a High-Purity Hexagonal Boron Nitride Crystal. Phys. Rev. B 2016, 94, 1-5.
Shotan, et al., Photoinduced Modification of Single-Photon Emitters in Hexagonal Boron Nitride. ACS Photonics 2016, 3, 2490-2496.

* cited by examiner

*Fig. 1C*
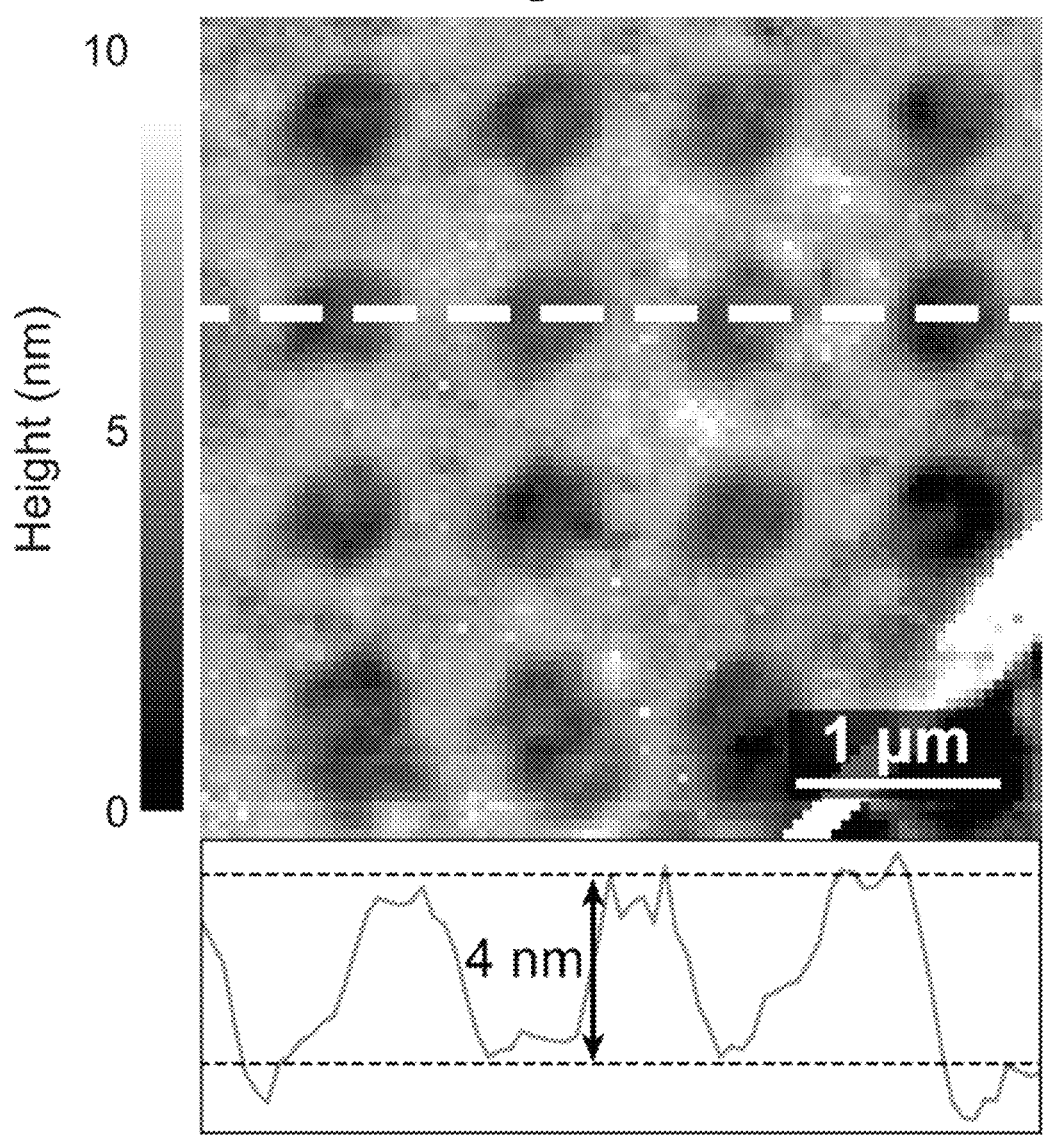
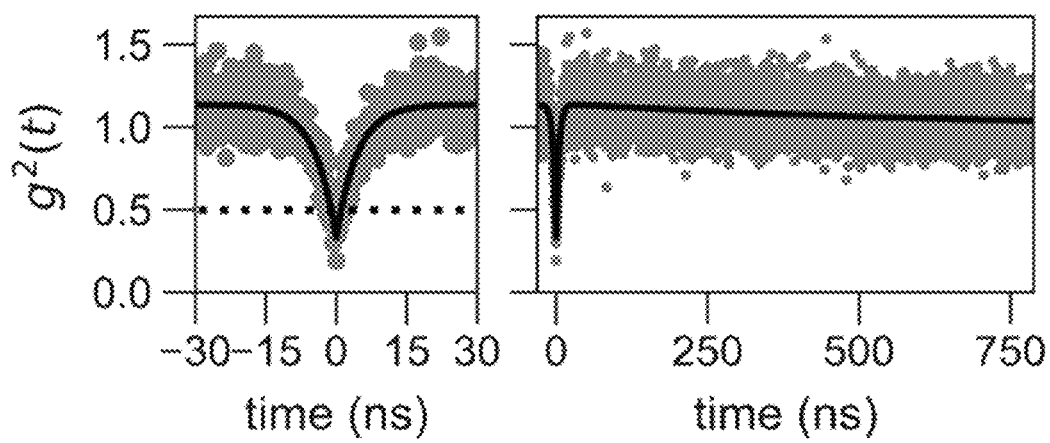
*Fig. 1D*

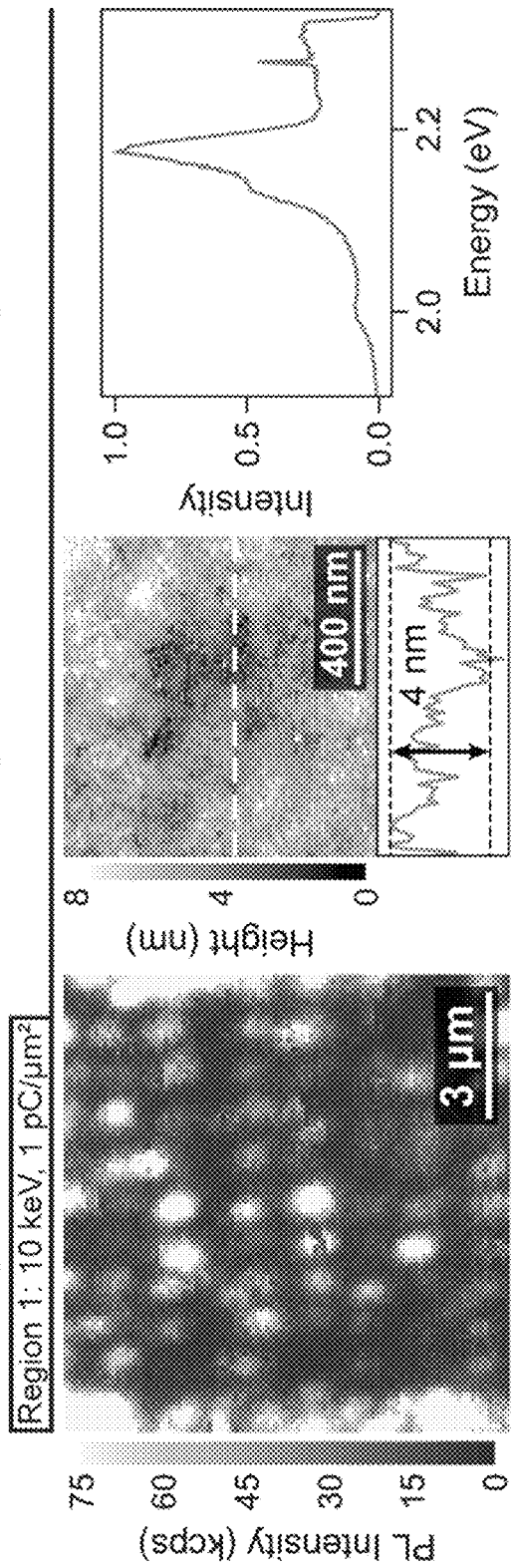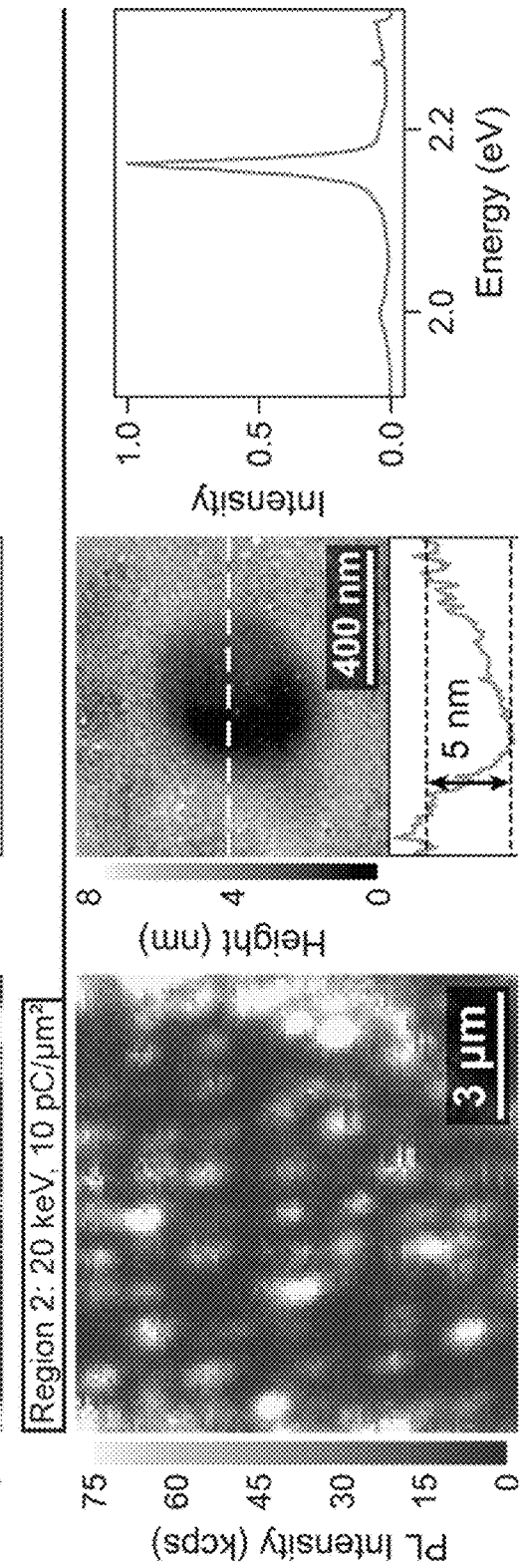

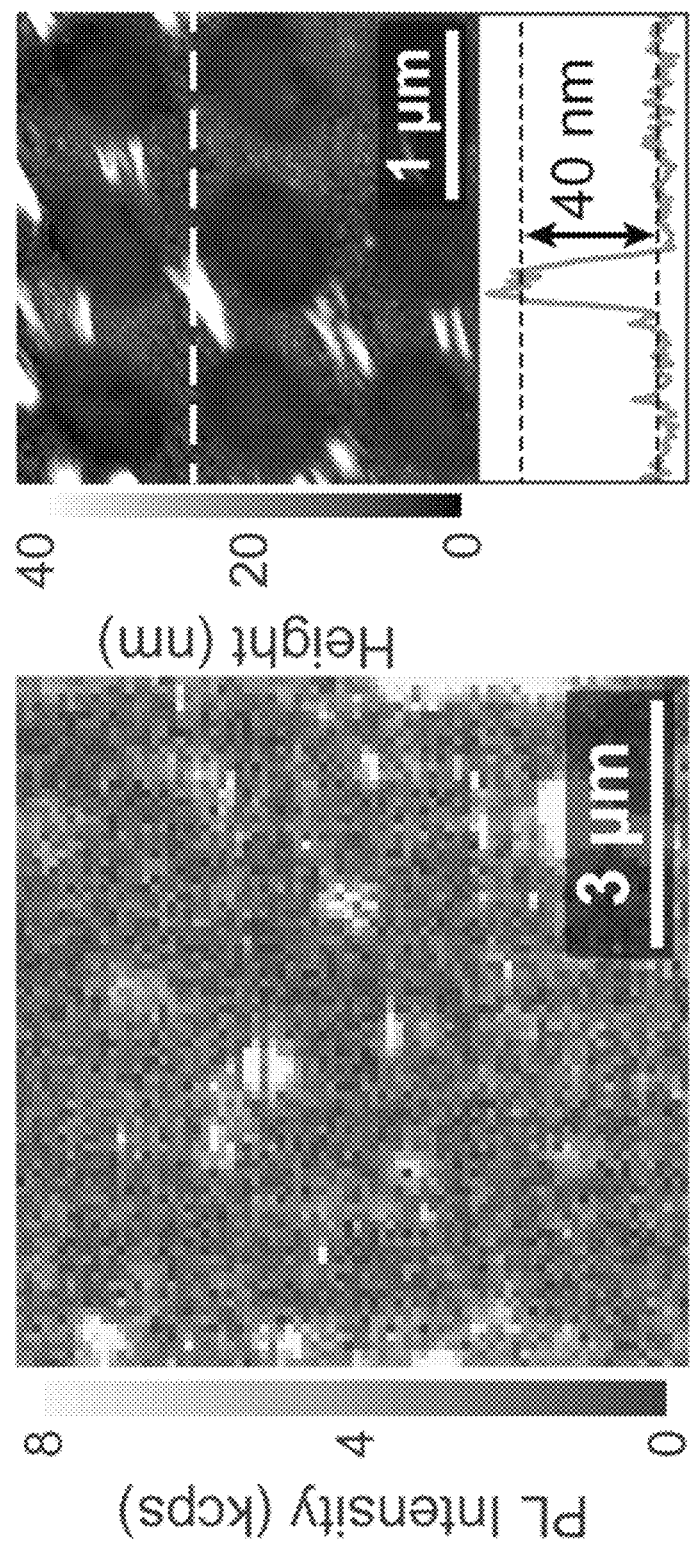

DETERMINISTIC QUANTUM EMITTER FORMATION IN HEXAGONAL BORON NITRIDE VIA CONTROLLED EDGE CREATION

CROSS-REFERENCE TO RELATED APPLICATIONS

This application claims priority from U.S. Provisional Patent Application 62/804,535 filed Feb. 12, 2019, which is incorporated herein by reference.

STATEMENT REGARDING FEDERALLY SPONSORED RESEARCH OR DEVELOPMENT

This invention was made with Government support under contract DMR-1532225 awarded by the National Science Foundation. The Government has certain rights in the invention.

FIELD OF THE INVENTION

The present invention relates generally to solid state optical devices. More specifically, it relates to the quantum emitters and their fabrication.

BACKGROUND OF THE INVENTION

Sources of single photons are a key component of many emerging quantum information technologies such as quantum computation, communication, and sensing. However, the more commonly used quantum emitters (QEs), such as cold atoms and spontaneous parametric down-conversion sources, require complex setups that limit their viability for widespread use. In contrast, solid-state QEs require significantly simpler setups because they can operate in ambient conditions. In addition, they have the possibility of high quantum efficiency and integrability with on-chip devices.

Ultrabright and stable QEs have been observed to occur stochastically at edges or regions of high curvature in hexagonal boron nitride (hBN), a large-bandgap 2D material. However, no method exists for deterministically and reliably fabricating QEs in hBN at desired locations in a manner suitable for integration with hybrid quantum devices.

BRIEF SUMMARY OF THE INVENTION

The inventors have discovered a method to deterministically create QEs at controlled locations in hBN. QEs are fabricated by creating edges having specific characteristics, e.g., using patterned milling of holes in hBN using a gallium focused ion beam (FIB). Through the use of specific milling and annealing parameters, a 31% yield of single QEs was achieved. It was discovered that the QEs form best and with preferably properties through uniform milling of smooth holes on relatively smooth chemical vapor deposition (CVD) hBN. The result of this method is a fabricated QE nanoscale device with specific size and shape characteristics. Also provided are arrays of such QEs. Optical confocal microscopy confirmed that such an array exhibits an array of bright, localized photoluminescence that match the geometry of the patterned holes. Second-order photon correlation measurements on these bright spots confirm that they contain single and multiple QEs. This technique dramatically broadens the utility and convenience of hBN QEs and achieves a vital step toward the facile integration of the QEs into large-scale photonic, plasmonic, nanomechanical, or optoelectronic devices.

In one aspect, the invention provides a quantum emitter device comprising a substrate made of silicon dioxide; a layer of hexagonal boron nitride (hBN) on the substrate; and a hole milled in the layer of hBN. The hole preferably has a side wall angle 1.1°±0.28° from the horizontal, has an oval shape with minor axis 516 nm±20 nm and major axis 600 nm±20 nm, and/or has a depth 4 nm±1 nm. The hBN layer preferably has a total thickness of 5-10 nm. The device may include multiple holes milled in the layer of hBN, which may have a density of 1 hole per 1 μm².

In another aspect, the invention provides a method of fabricating solid-state quantum emitters in 2D hexagonal boron nitride comprising providing a layer of hexagonal boron nitride (hBN) on a substrate made of silicon dioxide, and fabricating holes in the layer of hBN. The fabricating of the holes may use a gallium focused ion beam with ion dose of 10 pC/μm², and beam energy of 20 keV, a helium focused ion beam, preferably about 100 pC/μm² dose at an energy of 25 keV, electron beam directed etching at 25 and 15 keV and at a dose of ~1 pC/μm², performed in H2O vapor, or photolithography and reactive ion etch (RIE) with sidewall tapering. The fabricating of the holes may use photolithography to define array of holes with ~500 nm diameter in photoresist, performing reactive ion etching with Ar or XeF₂ ions.

BRIEF DESCRIPTION OF THE SEVERAL VIEWS OF THE DRAWINGS

FIG. 1C is an atomic force microscope (AFM) image of a focused-ion-beam milled region of hBN according to an embodiment of the invention.

FIG. 1D shows an example of $g^2(t)$ data with two different time windows for a single QE according to an embodiment of the invention.

FIGS. 2A-C show confocal, AFM, and representative photoluminescence spectrum for a QE according to an embodiment of the invention.

FIGS. 2D-F show confocal, AFM, and representative photoluminescence spectrum for a QE according to a preferred embodiment of the invention.

FIG. 6A is a confocal image of a region of a CVD hBN showing very poor visibility of the array.

FIG. 6B is an AFM image of the same region of FIG. 6A, showing a large amount of wrinkles.

DETAILED DESCRIPTION OF THE INVENTION

Figure 1A:
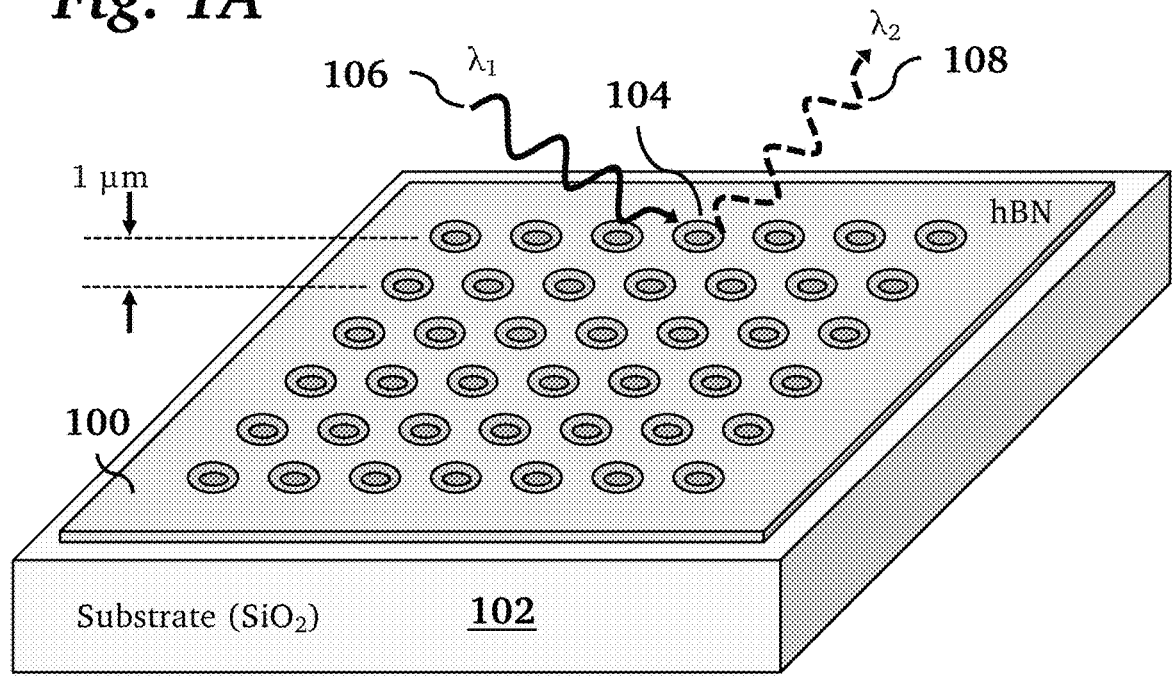
FIG. 1A is a schematic perspective view of an array of quantum emitter devices according to an embodiment of the invention.

FIG. 1A shows an array of deterministically fabricated quantum emitter devices according to an embodiment of the invention. Each of the quantum emitter devices 104 includes a layer of hexagonal boron nitride 100 on a substrate 102, where a hole is milled in the layer of hexagonal boron nitride 100. The substrate 102 is preferably silicon dioxide, which may be on silicon or quartz (not shown). In this example, the density of holes in the hBN layer 100 is 1 per 1 $\mu m^2$, which, at 33% yield, implies a single-photon QE density of 1 per 3 $\mu m^2$. When excited with light 106 at wavelength $\lambda_1$ a QE emitter device 104 can emit a single photon of light 108 at wavelength $\lambda_2$.

Figure 1B:
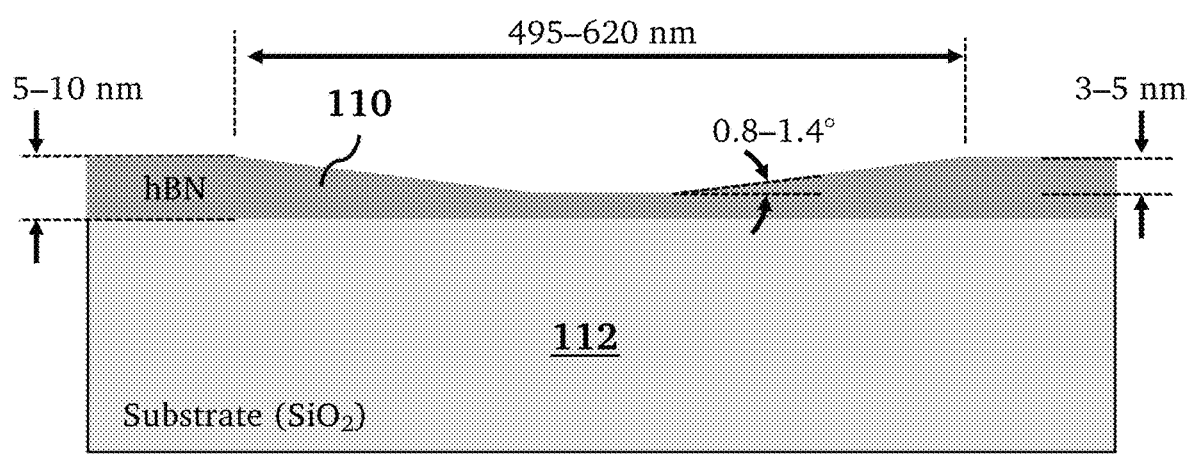
FIG. 1B is a cross-sectional view of a quantum emitter device according to an embodiment of the invention.

The structural details of a single quantum emitter device 104 according to an embodiment of the invention are shown in FIG. 1B. The hBN layer 110 on the substrate 112 preferably has a total thickness of 5-10 nm and is substantially smooth CVD hBN with low density of photoactive defects. The hole milled in the layer of hBN layer 110 preferably has a side wall angle of 1.1°±0.3° from the horizontal (i.e., a very shallow angle). The hole preferably has an oval shape with minor axis length 515 nm±20 nm and major axis length 600 nm±20 nm. The hole depth is preferably 4 nm±1 nm.

A method of making an array of solid-state hBN quantum emitters according to an embodiment of the invention includes fabricating in a layer of hBN holes having the properties described above in relation to FIG. 1A and FIG. 1B. The holes may be fabricated using a gallium focused ion beam with ion dose of 10 pC/$\mu m^2$, and beam energy of 20 keV. Alternatively, the holes may be fabricated with helium FIB, preferably about 100 pC/$\mu m^2$ dose at an energy of 25 keV adapting techniques of Allen, et al., Nanoscale 2019, 11, 1403-1409. Alternatively, the holes may be fabricated using electron beam directed etching at 25 and 15 keV and at a dose of ~1 pC/$\mu m^2$, performed in $H_2O$ vapor, adapting techniques of Elbadawi, et al., Nanoscale 2016, 8, 16182-16186.

Alternatively, the holes may be fabricated using photolithography and reactive ion etch (RIE) with sidewall tapering. Specifically, conventional or electron beam photolithography is used to define array of holes with ~500 nm diameter in photoresist. This photoresist is thick enough and selectivity is good enough for it to serve as an etch mask. Reactive ion etching can be performed with Ar or $XeF_2$ ions. A 4 angstrom/minute etching rate in an Ar RF plasma at 0.2 Torr and 80 W at room temperature may be used. Achieving a low angle etch profile may be achieved using a slight lateral component to the Ar RIE etch or through grayscale photolithography.

In operation, a single-photon quantum emitter device emits a single photon when excited with light that has energy greater than the energy level spacing of the device (e.g. a $\lambda_1$=532 nm laser can excite an emitter with an energy level spacing of less than 2.33 eV). This is the primary identifying feature of a single photon emitter, as the name suggests, although others are known to emit light when electrically rather than optically stimulated (e.g. carbon nanotubes). Unlike other single photon emitters (e.g., color centers in diamond like the nitrogen-vacancy center), they can emit light in a broad range of colors, in the range $\lambda_2$ 532-750 nm.

These hBN quantum emitters according to the present invention can be fabricated as components in a variety of devices and applications. For example, QEs may be used as electric field sensors, since the color of their emitted light is significantly shifted via the Stark shift, as observed by Noh, et al., Nano Lett. 2018, 18, 4710-4715. An array of QEs allows for single shot-readout of electric field with 1 $\mu m$ resolution across a whole chip by measuring the color of emitted light of each emitter.

Quantum emitters of the present invention could also be used to generate photon cluster states to be used in all-optical quantum repeaters, devices used to extend the range of quantum communication.

More examples of potential applications of single photon emitters can be found in Aharonovich, et al., Nat. Photonics 2016, 10, 631-641.

EXAMPLES

To create QEs in our hBN via edge creation, we transfer few-layer CVD hBN (Graphene Supermarket) onto $SiO_2$ and then use FIB to mill holes into the hBN, thereby forming edges at the hole perimeter. We do not perform an additional irradiation to activate QEs. The required dose to remove hBN material was in the range $10^{-13}$ C/$\mu m^2$ to $10^{-10}$ C/$\mu m^2$, with beam energies from 5 to 30 keV. Initial tests showed that energies of either 10 or 20 keV and milling doses of 1 pC/$\mu m^2$ were close to optimum for QE creation, as inferred by $g^2(0)<0.5$ (see FIG. 1D), so we studied two near-optimal conditions within this parameter range in greater depth. In one region of our sample (Region 1), we used the FIB milling conditions of 10 keV and 1 pC/$\mu m^2$, while in another region (Region 2) we used 20 keV and 10 pC/$\mu m^2$. To generate a high density of single, optically addressable QEs with enough perimeter for QEs to form, we FIB patterned arrays of 500 nm diameter circular holes with a center-to-center separation of 1 $\mu m$ in each region. An atomic force microscope (AFM) image of these holes is shown in FIG. 1C, with a line cut shown below. The FIB was operated at 20 keV and 10 pC/μm². The depth of the holes for this FIB condition was approximately 4 nm or 12 hBN atomic layers. After milling, hBN flakes were annealed in oxygen at 850° C. This process serves to activate QEs while simultaneously removing carbon deposited by the FIB or residual organic material. This annealing step is usually performed in an inert (argon or nitrogen) environment, but annealing in oxygen typically does not affect QEs in hBN. Although we are reporting results from CVD hBN, we also tested exfoliated hBN (HQGraphene), but the samples appeared to have a very high native defect density, making it difficult to characterize single QEs.

The hole milling process under both FIB conditions is effective at deterministic patterning of localized photoluminescence (PL). By spatially mapping the PL of milled regions of the hBN flakes using a home-built confocal microscope, we find that FIB milling in Regions 1 and 2 both result in arrays of bright, highly visible spots with a periodicity matching that of the patterned features.

FIGS. 2A-F show confocal, AFM, and representative photoluminescence spectra for QEs made with various FIB parameters. FIGS. 2A-C correspond to Region 1: Low dose, low energy. FIGS. 2D-F correspond to Region 2: High dose, high energy. FIG. 2A is a confocal scan showing high QE visibility. FIG. 2B is an AFM image showing rough, non-uniform milling. FIG. 2C is a representative photoluminescence spectrum showing a single emission line with a broad background. FIG. 2D is a confocal scan showing high QE visibility. FIG. 2E is an AFM scan showing uniform milling and smooth sidewalls. FIG. 2F is a representative photoluminescence spectrum showing a QE spectrum with low background.

The contrast between the bright spots and the surrounding region between the bright spots is high (>20:1). These surrounding regions have a PL about 5 to 10 times lower than that regions of unmilled CVD hBN far from the milled sites (FIG. 7B), which also have many randomly scattered sites of localized PL. The relatively low background near the patterned bright spots may be due to the long Gaussian tails of the FIB spot exposing areas near milled holes to a low ion dose, which is known to remove fluorescent organic surface residues and photoactive defects. Thus, it appears that the reduction of background PL is a convenient side-effect of the milling process. We note that, although FIB patterning clearly generates patterned PL, the PL sources themselves may be localized inside the etched holes, on the hole edges, or in the unmilled regions between the edges. Techniques such as scanning near-field optical microscopy (SNOM), which overlay optical and topographical images, may help resolve this question. When we applied the conditions used in Regions 1 and 2 to wrinkled regions of CVD hBN and exfoliated hBN, we observed extremely low pattern visibility and we were unable to resolve single QEs. We suspect that these results in wrinkled regions are due to high compressive strain indicated by the wrinkles, while the results in exfoliated hBN may be due to the high native defect density of the sample. Optical data, AFM images, and further discussion of these regions are discussed in further detail below in relation to FIG. 6A-6B and FIG. 8A-8C. Altogether, the flat regions of CVD hBN milled under either FIB condition generate spatially localized, high contrast PL emission sites.

To assess the single-photon purity of individual bright spots formed by FIB milling, we perform antibunching measurements and obtain second-degree correlation function data, $g^2(t)$. FIG. 1D shows an example of $g^2(t)$ data for a single QE in Region 2 showing $g^2(0)=0.33$, well below the antibunching threshold for a single QE. The left section shows a 60 ns time window centered about t=0, while the right section shows a 800 ns window of the same data.

Figure 3:
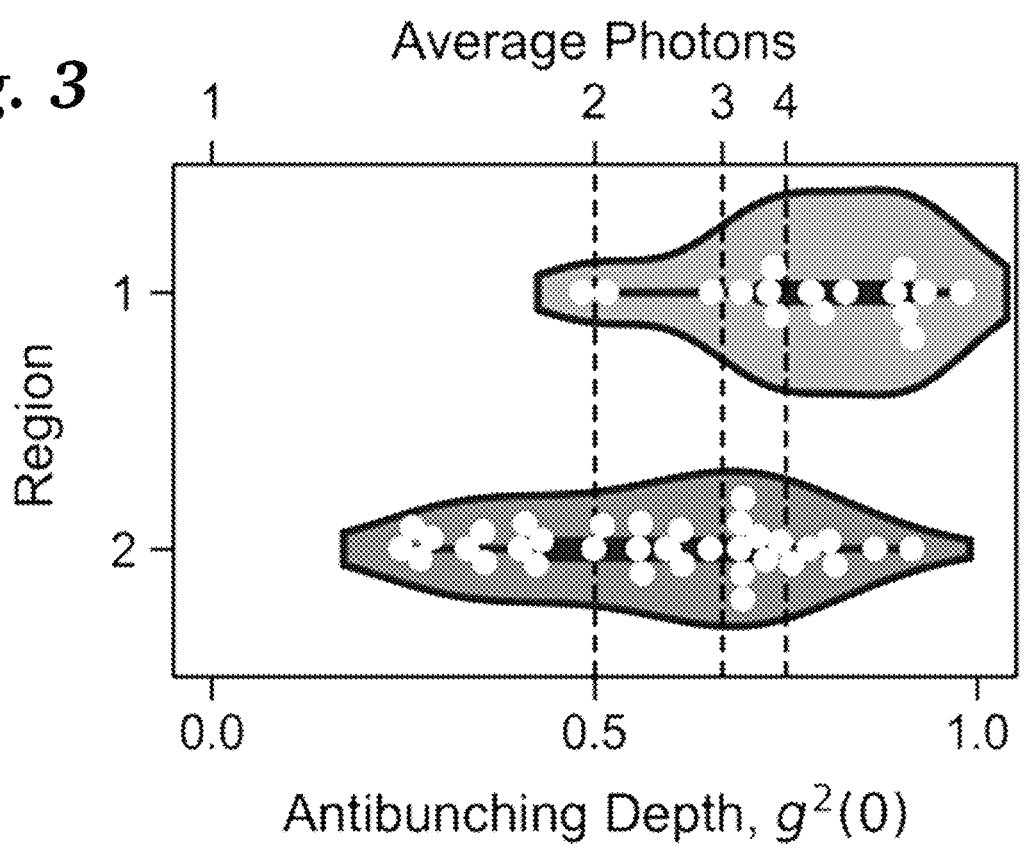
FIG. 3 is a graph showing distributions of degree of antibunching for two regions of FIB-treated CVD hBN according to an embodiment of the invention.

The antibunching data are fit by a three-level model to determine the antibunching depth of each milled site as well as other photophysical properties of the emitters. The average number of photons was determined from $g^2(0)$ from the equation $g^2(0)=1-(1/n)$, where n is the average number of photons emitted. A site was denoted as zero average photon number if there was no PL signal from the site. FIG. 3 shows distributions of degree of antibunching for both regions of FIB-treated CVD hBN (Region 2). This violin plot of antibunching depth for each region shows the larger overall degree of antibunching in region 2. Top axis labels show average photon numbers corresponding to antibunching values. The lines at antibunching values correspond to 2, 3, and 4 average photons.

The cutoffs correspond to the number of QEs for ideal single photon emission, which would have zero probability of two photon emission and no background light. Even without ideal single QEs, a $g^2(0)<0.5$ unambiguously indicates a single QE. We use this cutoff to classify sites as hosting single QEs and do not attempt to perform any background subtraction. This is primarily because any significant background must be local, as indicated by the high contrast confocal image, and is further motivated by the inherent difficulty of accurately deconvolving background and signal light.

The FIB milling approach is effective at fabricating patterned single QEs. To assess the antibunching of milled regions and the effectiveness of making single QEs, we characterized rows that appeared representative and characterized all FIB milled sites in those rows. In Region 1, we performed antibunching characterization on two adjacent rows of nine sites. In Region 2, we characterized four rows of nine sites; we also chose three adjacent rows as well as one row 20 μm above those three to check that the results were roughly consistent across the region. In Region 1, we measured an average antibunching depth of $g^2(0)=0.78\pm0.15$, corresponding to an average photon number of 4.5. In this region, we found only one site exhibiting the antibunching signature of a single QE ($g^2(0)<0.5$) out of 18 measured FIB milled holes, although all 16 that showed PL exhibited some amount of antibunching and 13 had antibunching characteristic of less than 4 QEs. On the other hand, in Region 2, we measured an average antibunching depth of $g^2(0)=0.57\pm0.19$, corresponding to an average photon number of 2.3. In this region, 11 out of 36 of milled holes had the antibunching characteristic of a single QE, demonstrating a single QE creation yield of 31%. Moreover, of the 34 of 36 holes in Region 2 that showed PL, all exhibited some amount of antibunching, demonstrating a QE creation yield of 94%. Our 31% yield of sites with single QEs is close to the theoretical maximum of 36.8% for a Poissonian QE creation process. The single QE yield is about 2.5-times greater than the yield achieved by nanopillar strain engineering. Combining the site areal density (1 site per 1 μm²) with the single QE yield, we calculate a single QE areal density of about 1 per 3 μm². For a typical size hBN sheet (~50 μm×~50 μm), this density would create over 800 individually addressable single QEs. To estimate the amount of FIB milled edge necessary to create single QEs using our processing parameters, we use the hole circumference (~1.5 μm) and the single QEs yield (~1 per 3 holes) to find a single QE linear density of ~1 per 5 μm of ion milled edge.

In addition to exhibiting markedly different yield of single QEs, Regions 1 and 2 also differ in their PL spectra. Typical spectra for sites in Region 1 ($g^2(0)$>0.5) and Region 2 ($g^2(0)$<0.5) are shown in FIG. 2C and FIG. 2F, respectively. The sharp peak at 2.27 eV corresponds to the silicon Raman peak for 532 nm excitation. Spectra from Region 1 tend to exhibit a single sharp emission line but often have a broad background. Combined with the high pattern contrast in confocal images for this region, this suggests that the milling parameters in Region 1 create a large amount of background PL localized to the milling site. This background is at least one of the factors contributing to the low photon purity in this region. However, it is possible that there are multiple QEs contributing to a single sharp emission line. The very low amount of antibunching measured in Region 1 suggests that both factors likely contribute. In Region 2, we again often see a single primary emission line but the background is considerably lower compared to Region 1. Therefore, the higher energy and larger dose used to mill Region 2 is likely more effective at removing fluorescent contaminants and defects and thereby leads to a lower background PL and a higher photon purity. Combined with the demonstrated high amount of antibunching in Region 2, these data show that the high energy, high dose FIB parameters are preferred for QE creation.

Another key difference between Region 1 and 2 is the surface topography near the emission sites. Using AFM to measure the topography, we find that the holes in Region 1 (low energy, low dose) are poorly defined, nonuniform, and rough (see FIG. 2B) with an arithmetic mean roughness, $R_a$, of 0.6 nm in the center of the hole. In contrast, the holes in Region 2 (high energy, high dose) have a well-defined circular shape and a smooth profile (FIG. 2E) with a depth ~5 nm over a lateral distance of 200 nm, and an arithmetic mean roughness, $R_a$, of 0.23 nm in the center of the hole. The roughness seen in Region 1 provides further evidence that fluorescing contaminants may not be thoroughly etched away under these FIB milling conditions. Through the formation of many deep pits, the milling in Region 1 created a large amount of in-plane edges on which QEs could form, in agreement with the hypothesis that edges are responsible for QE formation in hBN. Our AFM measurements suggest that a smooth, uniformly milled hole is optimal for single QE formation.

Figure 4:
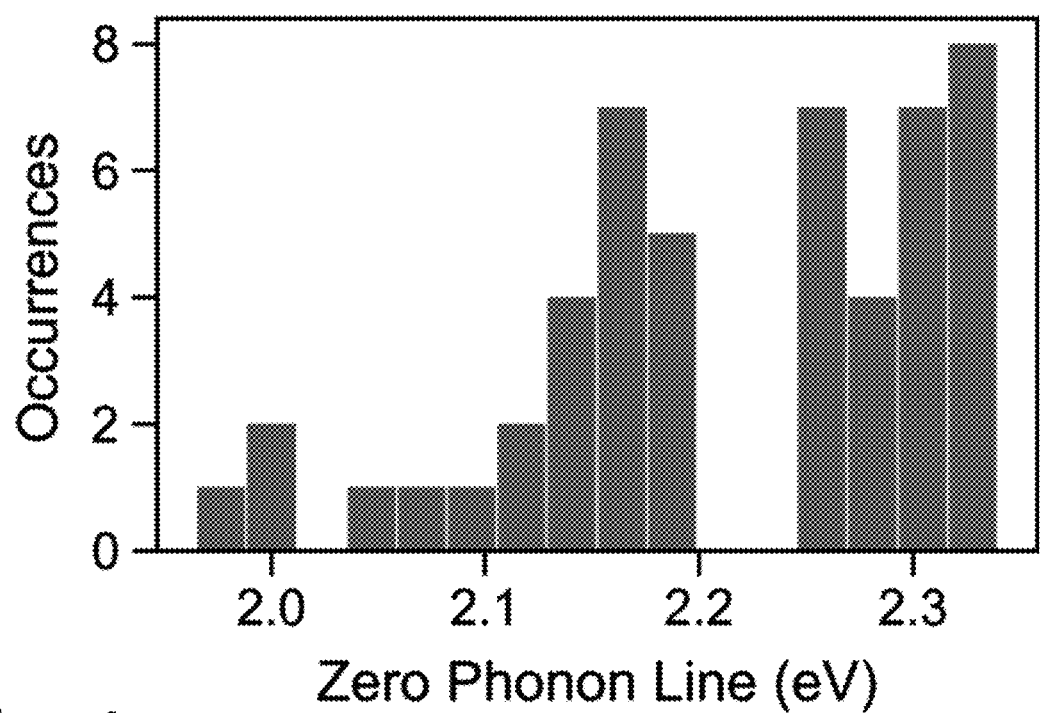
FIG. 4 is a histogram showing zero phonon line energies across a collection of hBN quantum emitters according to an embodiment of the invention.

As compared to other techniques to activate QEs in hBN, the QEs created through FIB milling were similar in terms of the distribution of zero phonon lines (ZPLs), PL intensity, and optical stability. FIG. 4 shows zero phonon line energies across all emitters for which there was a clearly identifiable central emission line showing a similar distribution of energies compared to QEs found in CVD hBN suspended on nanopillars.

In the setup we used to take antibunching measurements we filter light with energy above 2.25 eV, however, the phonon sideband from those emitters was below the cutoff and allowed through to our detectors. In PL spectra, we find phonon sidebands at 150±23 meV from their respective zero phonon lines, consistent with previous observations. To further compare our QEs to those created by other methods, we measure PL intensity versus power for our emitters in Region 2 and fit that data to a first order saturation model, $I(P)=I_\infty P/(P+P_{sat})$ (see FIG. 7C). We find that our brightest emitter has an $I_\infty$ of roughly 2.6 Mcps, on par with other hBN quantum emitters. Across the 11 single QEs, roughly 33% were optically stable for the entire measurement duration, a few hours of illumination at 80 μW excitation power. Of these 11, only one bleached entirely and stopped emitting PL. The remaining six exhibited some blinking without fully bleaching. This blinking and bleaching behavior is similar to what is observed in hBN QEs created using other methods, suggesting that our FIB milling procedure is at least as effective at creating optically stable emitters.

Figure 5A:
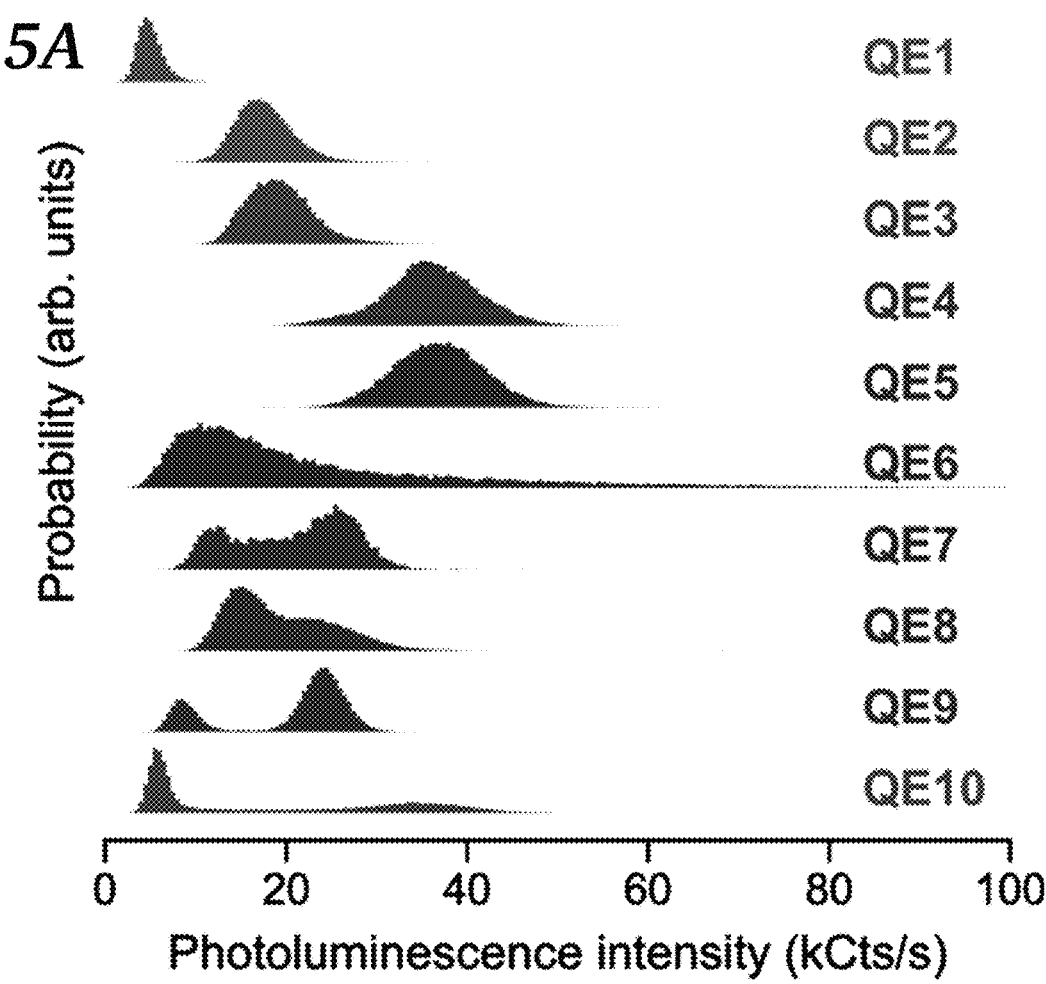
FIG. 5A compares photoluminescence intensity of several single quantum emitters according to an embodiment of the invention.
Figures 5B, 5C:
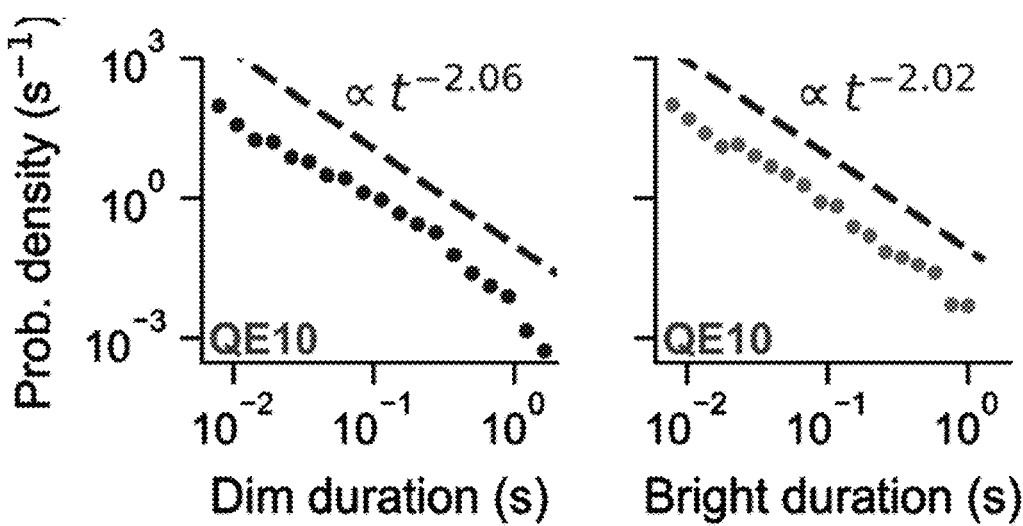
FIG. 5B is a graph of probability density of the dim state lifetime of a quantum emitter according to an embodiment of the invention.
FIG. 5C is a graph of probability density of the bright state lifetime of a quantum emitter according to an embodiment of the invention.

The FIB milling approach produces a high density of individually addressable single QEs. Leveraging our ability to generate large quantities of single QEs, we study the PL blinking dynamics of large numbers of hBN QEs in a relatively uniform surrounding environment (e.g., substrate, charge, strain). We measure the probability distribution of PL intensity for 10 single QEs as histograms binned by brightness at fixed 80 μW excitation laser power. FIG. 5A shows PL intensity of the single QEs. The last one, labeled QE10, shows blinking behavior that we analyze in FIG. 5B, which shows the probability density of the dim state lifetime. The offset dashed gray line is a power law fit to the data with power 2.06±0.08. FIG. 5C shows the probability density of the bright state lifetime. The offset dashed gray line is a power law fit to the data with power 2.02±0.05. While some QEs show a single peak (QE 1 to 6), others (QE7-10) show two peaks, suggesting a bright and dim state. Furthermore, some have a narrow distribution centered near a single intensity, while others are broader and even exhibit long tails. To characterize the blinking behavior of a single QE with distinct bright (or "on") and dim (or "off") states, that is, a QE that exhibits PL distributions with two nonoverlapping peaks, we measure the probability that a given blink will last a certain duration of time. Performing this analysis on QE10, we specify the dim state as PL intensity less than 17 kCounts/s and the bright state as PL intensity greater than 19 kCounts/s for QE10 at this excitation power. This type of analysis is only appropriate for two-state emitters with a clear threshold (e.g., QE9 and 10).

The probability density data for the dim (FIG. 5B) and bright (FIG. 5C) states show that short blinks occur more often than long-lasting blinks. We fit these data to a dominant power law, probability proportional to $t^{-2}$ for QE10 over the time scales shown, where t is the state duration, consistent with the power law observed in other quantum emitters, and in contrast to systems that show an exponential behavior with a single characteristic time. The dominant power law we observe rules out a simple charging model, which would predict an exponential distribution, but leaves a variety of blinking models as possibilities, including modified charging models, where the barrier between two states can vary. The bright state of QE9 does not show a simple power law fit over the same time scale, as discussed further below. It may be possible to mitigate PL intensity fluctuation through the use of a passivating layer or a more pristine substrate. However, this analysis, together with the ability to generate many single QEs, may help to shed light on the mechanisms governing PL instabilities in hBN QEs by showing that something other than simple charging is causing this blinking.

While we have found a combination of dose, energy, and defocus that yields high quality QEs, it may be possible to push the single photon purity and density of these QEs higher through further exploration of the rich parameter space available with FIB milling. Beyond the simple parameters we explored, changing FIB defocus or angle may reduce roughness of milled hBN and result in reduced background PL. Because of the relative independence of QE formation to ion type, a helium FIB or electron beam could be used to perform this milling in a less destructive way and enable greater single photon purity. Our approach achieved a single QE density of 0.33/μm², which is largely determined by the hole array density (1/μm²). Thus, a simple way to increase the single QE density may be to decrease the hole spacing, perhaps while altering hole geometry to maintain a constant perimeter. It should also be possible to expand this technique beyond electron or ion beam milling by using a combination of photolithography and reactive ion etch (RIE) processes to pattern holes in hBN. Such a generalization of this technique would dramatically lower the barrier for further studies and applications of hBN QEs.

AFM measurements show that the FIB process does not result in high curvature, which suggests that the process of QE formation via edge creation is distinct from the high curvature method in other approaches to QE fabrication. The dual QE generation pathways (i.e., edges or high curvature) may be due to local band structure shifts due to strain or edge relaxation. It may also be that high strain or edges allow for local reconstruction of the hBN, leading to formation of optically active Stone-Wales-like defects.

Sample Fabrication and Surface Characterization

The samples used in this study were prepared by polymer transfer of ~15 layer CVD hBN purchased from Graphene Supermarket. Samples were annealed in oxygen at 850° C. for a half hour both before and after focused ion beam milling in order to remove hydrocarbon contaminants. Focused ion beam milling was performed on a FEI Helios Dual-Beam gallium FIB with beam parameters set as noted above. Before milling, the sample and chamber were plasma cleaned with air for 5 min to remove residual hydrocarbons. AFM measurements were performed on a Bruker Dimension FastScan atomic force microscope operated in PeakForce mode.

Optical Measurements

We performed initial confocal scans and antibunching experiments of QEs in a home-built confocal microscope equipped with a 532 nm solid state laser (OptoEngine), 100× 0.7 NA objective and two avalanche photodiodes (Micro Photon Devices) in a Hanbury Brown-Twiss setup. All optical measurements were performed at an excitation power of roughly 80 μW. Time-correlated single photon counting was performed on a PicoQuant TimeHarp 260. These measurements were used to determine if PL sources were QEs, and also yielded their average photon number, nonradiative and radiative lifetimes, and bunching amplitude. These parameters were extracted from antibunching measurements by fitting our data to a simple model for a three-level system:

$$g^2(t)=1-\rho^2+\rho^2[1-(1-a)e^{-|t|/\tau_1}+ae^{-|t|/\tau_2}],$$

where $a$ is the bunching amplitude, $\tau_1$ is the nonradiative lifetime, $\tau_2$ is the radiative lifetime, and $\rho^2=1-g^2(0)$ where $g^2(0)$ is the degree of antibunching. Photon number in a given milled hole was determined by binning $g^2(0)$ values according to $g^2(0)=1-(1/n)$. We measured the spectra of QEs using a commercial Witec Raman spectrometer equipped with a Peltier-cooled Andor iDus CCD.

We now discuss example of spectra with a peak wavelength below our filters, AFM data on unmilled CVD and exfoliated hBN, characterization of QEs on exfoliated hBN, and details on analysis performed on PL intensity variation.

Focused Ion Beam Milling of Wrinkled hBN Grown by Chemical Vapor Deposition

Processing of wrinkled chemical vapor deposition-grown (CVD) hexagonal boron nitride (hBN) gave a very poor yield of QEs despite using intermediate parameters to those which gave many QEs. We suspect that the QEs may have difficulty forming because these wrinkles indicate that the polymer transfer process damaged the hBN or that the hBN is under large compressive strain. FIG. 6A shows a confocal image of a region (milled at high energy, low dose) of CVD hBN showing very poor visibility of the array. FIG. 6B shows an AFM image of the same region showing the large amount of wrinkles.

Further Atomic Force Microscope Characterization of hBN

Figure 7A:
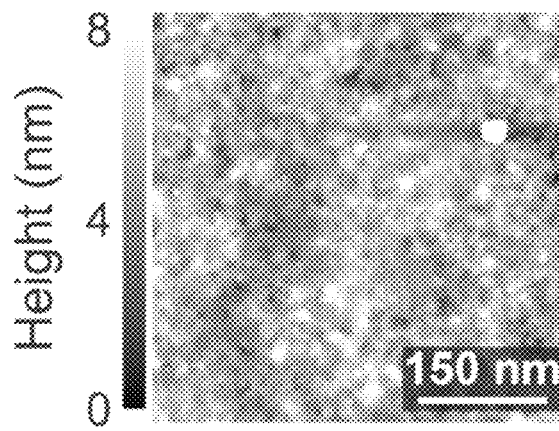
FIG. 7A is an AFM image of a region of CVD hBN nearby the FIBed region.
Figures 8A, 8B, 8C:
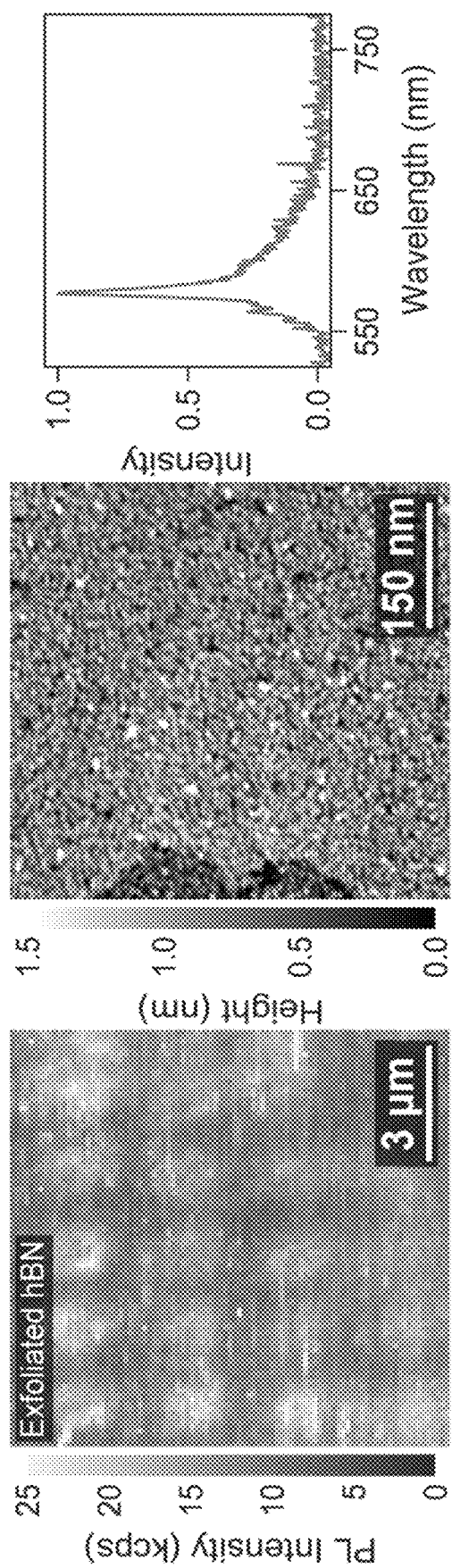
FIG. 8A is a confocal image of a FIBed region of exfoliated hBN showing the poor pattern visibility.
FIG. 8B is an AFM image of a region of unirradiated exfoliated hBN after processing.
FIG. 8C is a graph of the best spectrum found on a FIBed exfoliated flake.

FIG. 7A is an atomic force microscopy (AFM) image of the CVD hBN material which shows that the surface is fairly rough and textured nearby the FIBed regions characterized. This native texture of the hBN may have contributed to the high yield of QEs that we were able to achieve with our FIB and anneal procedure. On the other hand, FIG. 8B is an AFM image of a region of unirradiated exfoliated hBN after processing, which shows that the surface roughness is much less than the CVD hBN. This suggests that a good surface quality may not be sufficient indication of material quality for hBN QE formation.

Confocal Microscopy on Unmilled CVD hBN

Figure 7B:
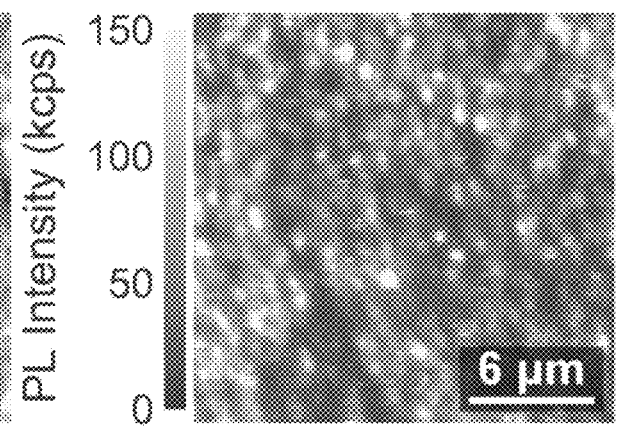
FIG. 7B is a confocal microscope image of unmilled hBN showing a large amount of localized photoluminescence.

To more completely understand how the CVD hBN was different from the exfoliated hBN, we performed confocal microcopy on unmilled regions of our CVD hBN nearby regions that had been milled and thoroughly characterized. These images show many areas of highly localized PL, which may suggest that this CVD hBN hosts a high number of QEs with only annealing. FIG. 7B is a confocal microscope image of unmilled hBN showing a large amount of localized PL. FIG. 8A is a confocal image of a FIBed region of exfoliated hBN showing the poor pattern visibility. FIG. 8C is an example of the best spectrum found on a FIBed exfoliated flake. Sharp peak may indicate a QE, but broad background prevents strong antibunching.

Measurement of Saturation Photoluminescence Intensity

Figure 7C:
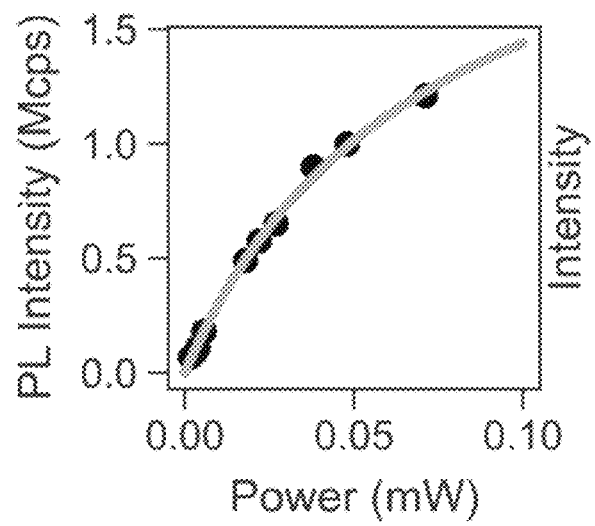
FIG. 7C is a plot of photoluminescence intensity vs. excitation power showing a best fit to a linear saturation model.

To determine the efficiency and brightness of the QEs created using our FIB milling technique, we measure the PL intensity at various powers and fit the data to a first-order saturation model of the form $I(P)=I_\infty P/(P+P_{sat})$. FIG. 7C shows PL intensity vs. excitation power data showing a best fit to a linear saturation model for the brightest emitter found in region 2 (high dose, high energy FIB milled CVD hBN). Calculated $I_\infty$ for this QE was 2.6 Megacounts per second.

Example of Spectra with Zero Phonon Lines Near 532 nm

Figure 7D:
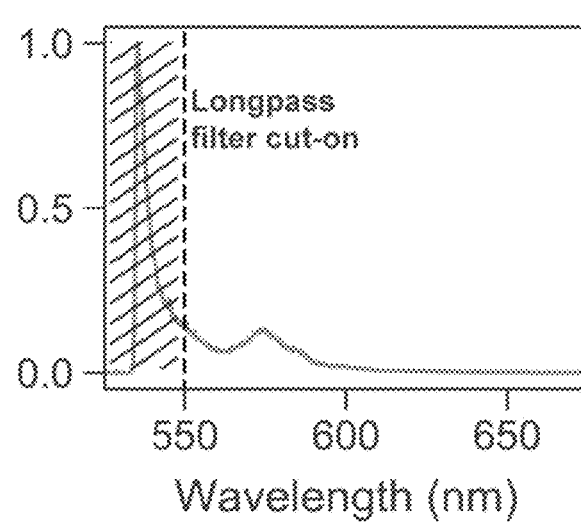
FIG. 7D is a graph of the spectrum of a low wavelength emitter showing the photoluminescence collected and spectrum observed.

Some spectra of quantum emitters (QEs) we found exhibited zero phonon lines with high energy, very close to the excitation energy. We had an optical filter in our confocal microscope that removed high energy zero phonon lines, but we measured the antibunching for these QEs and found that they were quantum emitters. An example of one such high energy zero phonon line is shown in FIG. 7D which plots the spectrum of a low wavelength emitter showing the PL collected and spectrum observed with a 550 nm long pass filter.

Quantum Emitter Creation in Exfoliated hBN

Attempts to create QEs in exfoliated hBN (HQGraphene) were successful in creating some QEs, but FIBed areas always had a broad background. This was the case using the same procedure as with CVD hBN, as well as with modified anneals and FIBing procedures. We found in general that we had poor QE visibility. We attribute this to a large amount of background PL, likely due to a large amount of native defects. After extended annealing (3 hours at 500 C) we were able activate some QEs with sharp emission lines, see FIG. 7C. However, we were unable to affect the broad background with any amount of annealing.

Photoluminescence Trajectories

Figure 9:
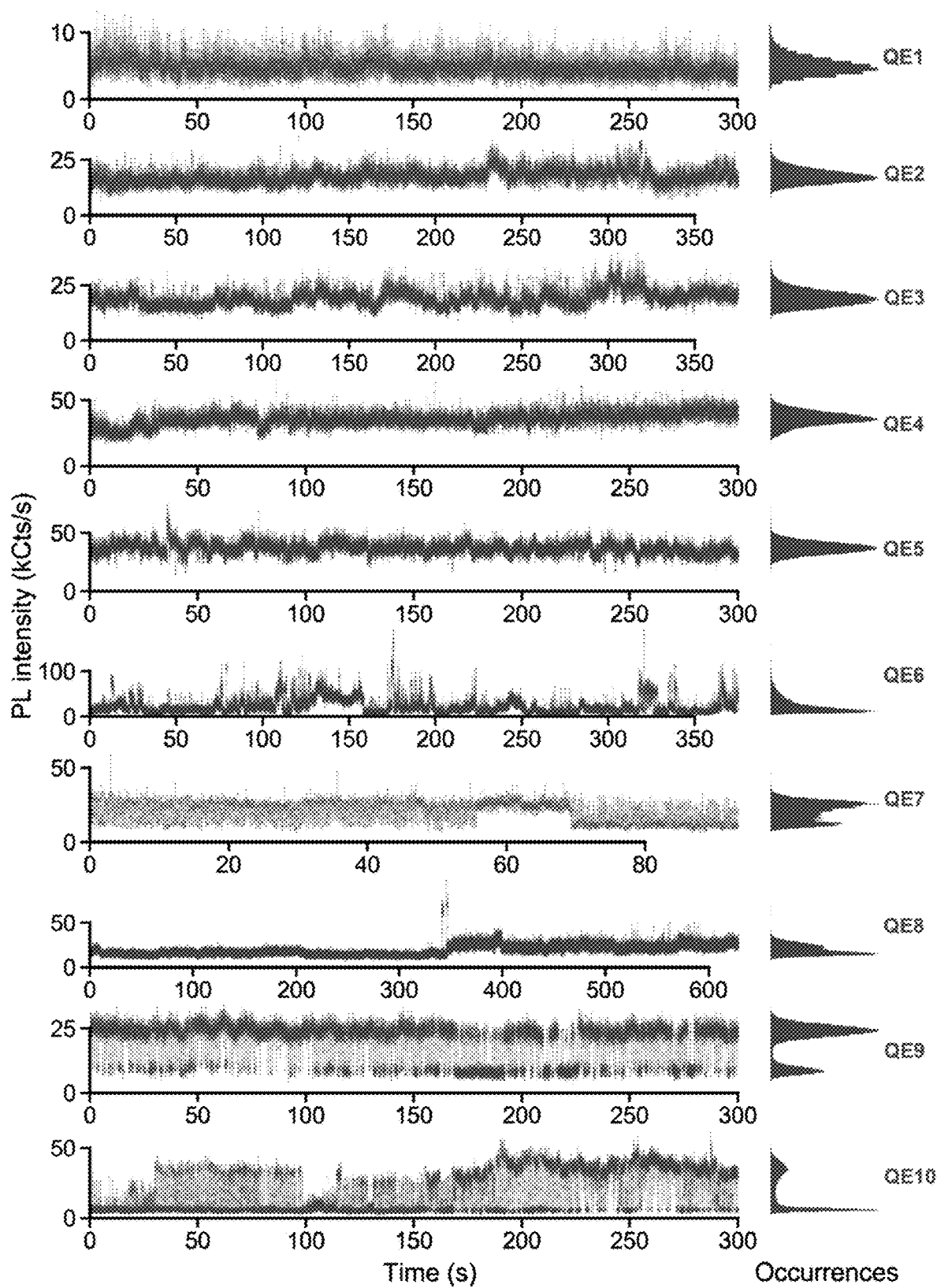
FIG. 9 shows photoluminescence intensity versus time and histograms for a collection of quantum emitters.

The photoluminescence trajectories for each of the 11 quantum emitters is shown in FIG. 9, where photoluminescence (PL) intensity versus time for QE1 to 10 is shown on the left and histograms corresponding to each trajectory are shown on the right. All QEs were excited with the same cw laser power, 80 μW, measured at the back opening of the objective. We maximized the polarization angle of the excitation laser prior to measuring the PL intensity of each QE. The collection rate was either 100 Hz or 125 Hz, corresponding to time bin widths of 10 ms or 8 ms, as follows: QE1 at 125 Hz, QE2 at 100 Hz, QE3 at 100 Hz, QE4 at 125 Hz, QE5 at 125 Hz, QE6 at 100 Hz, QE7 at 100 Hz, QE8 at 100 Hz, QE9 at 125 Hz, and QE10 at 125 Hz.

Power Dependence of Bright and Dim State

Figure 10:
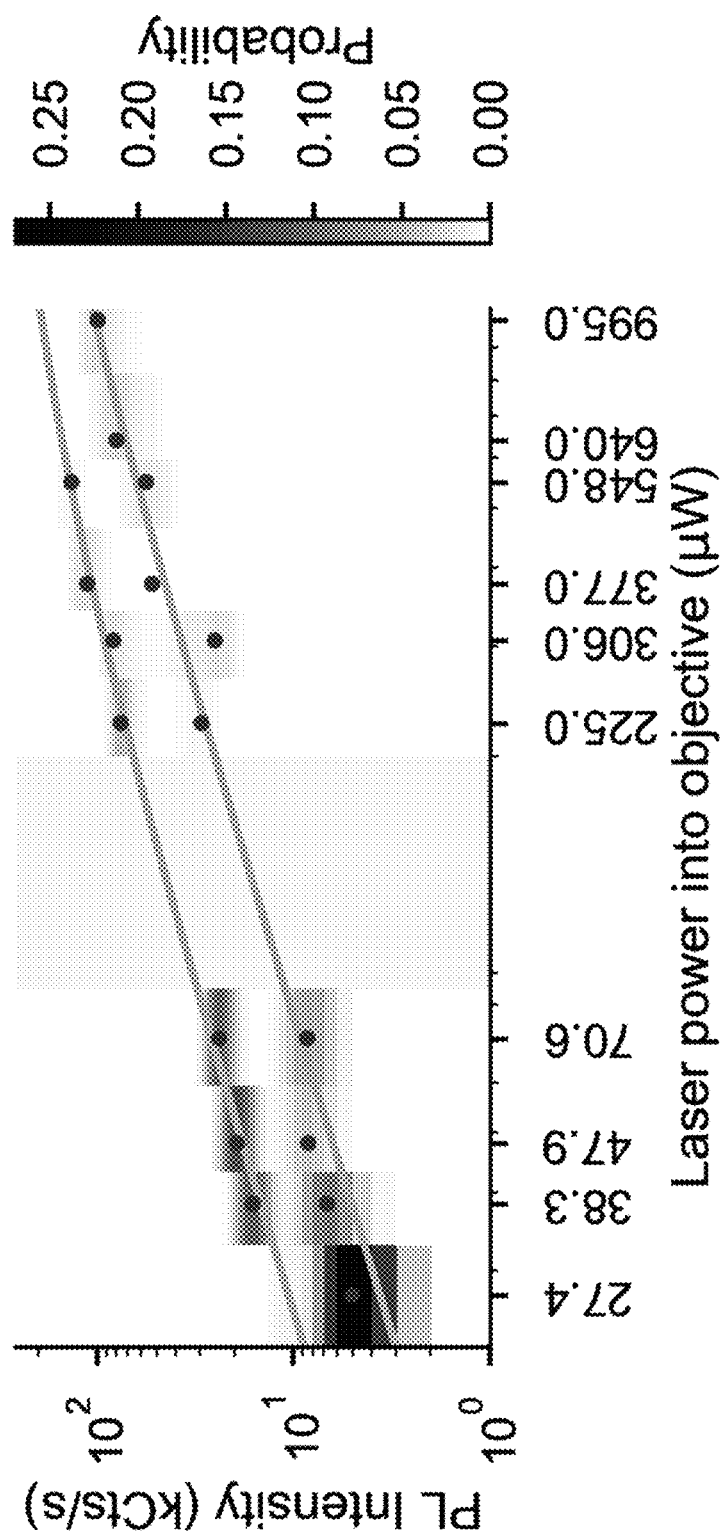
FIG. 10 is a graph of the bright state and dim state of a quantum emitter, showing an increase in photoluminescence intensity as the excitation laser power is increased.

Although the dim state emits fewer photons per second than the bright state, it is not fully 'off.' The dim state increases in PL intensity as the excitation laser power increases, as shown in FIG. 10 with fit to the first-order saturation model, similar to FIG. 7C. The bright state and dim state of QE9 both show an increase in PL intensity as the excitation laser power is increased.

A Long-Duration State does not Predict Another

Figure 11:
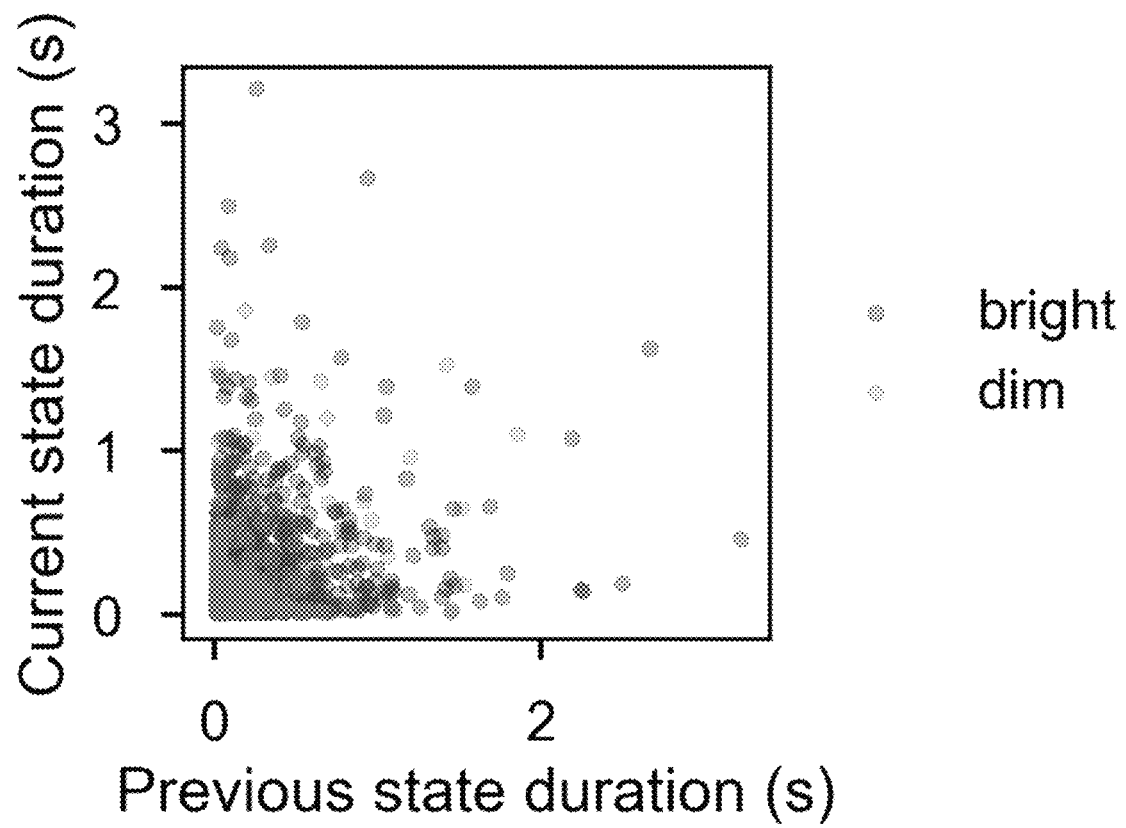
FIG. 11 is a scatter plot comparing bright and dim state duration and the previous bright and dim state duration in the photoluminescence trajectory of a quantum emitter.

We observe from the FIG. 9 histogram that QE9 has two distinct PL intensity levels, and, as was done for QE10, we calculate the probability density for the duration of the dim state and the bright state (FIG. 11), where we define the bright state as having PL intensity greater than 16.1 kCts/s and the dim state as having PL intensity less than 14.1 kCts/s for QE9 at this laser excitation power. This threshold is chosen based on the minimum of the histogram shown in FIG. 9. To investigate whether a long lasting bright state is expected to be followed by a second-long lasting bright state, we plot each state duration as a function of the previous state duration in FIG. 11. There is no clear trend for bright or dim states, suggesting a lack of correlation between the previous state duration and the current state duration.

Limitations of the Dominant Power Law

Figures 12A, 12B:
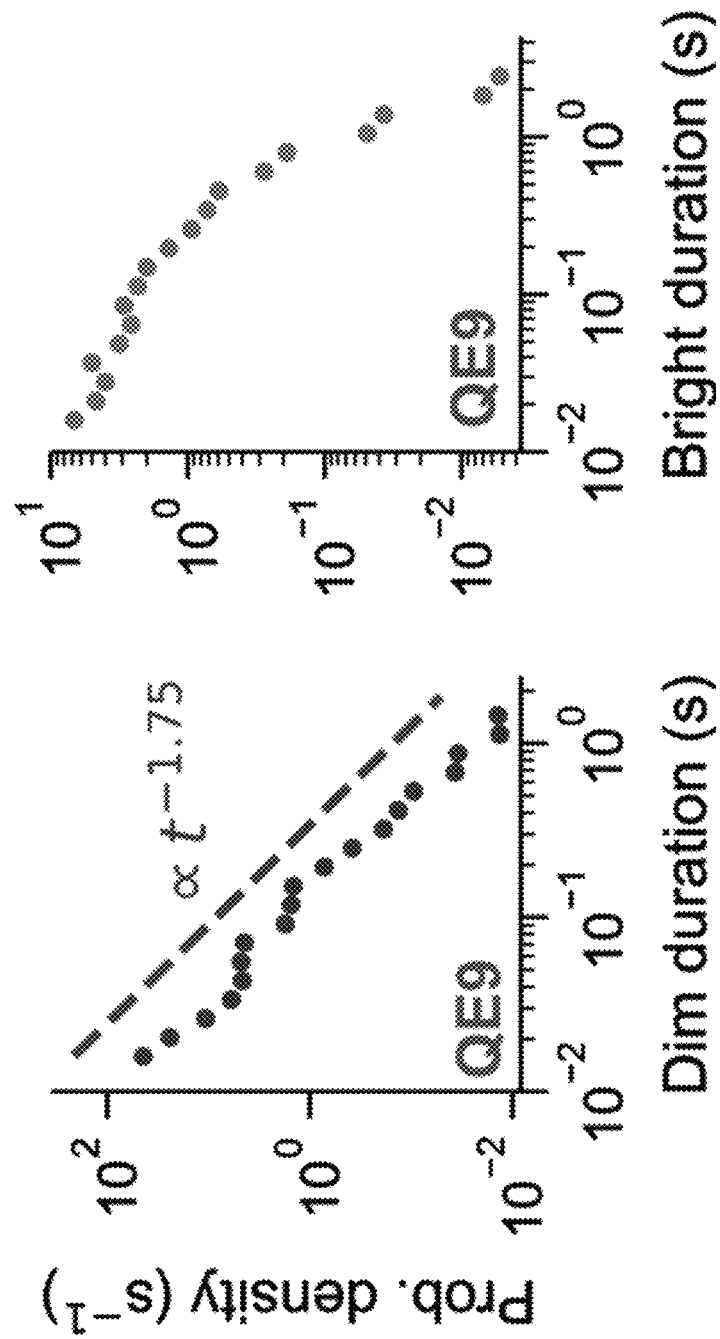
FIGS. 12A-B are graphs of the probability density of duration of each state for a dim state and bright state, respectively.

It is a mathematical impossibility for a probability distribution function (PDF) to show a power law that persists to infinity, because the integral would not converge, so the total probability would be infinite. Therefore, there must be a duration above which we observe a cut-off to the power law trend. Here we discuss evidence for such a cut-off in the two-state blinking data. For FIG. 9, the duration is first binned in unequal but logarithmically evenly spaced duration bin widths, then the probability is normalized by the duration bin width to obtain the probability density in units of inverse seconds. We observe that the dim state duration for QE9 shows a dominant power law, while the bright state duration deviates from power law behavior. This is seen in FIG. 12A-B which show the probability density of duration of each state for QE9. The dim state FIG. 12A shows a dominant power law with slope $\alpha=1.75\pm0.06$, while the bright state FIG. 12B deviates from power law behavior.

The shape of the data trend suggests a truncated power law, and we argue that, in fact, the probability distribution of the dim duration of QE9 and the probability distribution for both the bright and dim durations of QE10 are each best fit by a truncated power law, though it is not evident from the visible trend of the probability distribution function in FIG. 12A. We need to consider the cumulative distribution function for more insight.

The complementary cumulative distribution function (1-CDF) is the integral over the probability distribution function p(t') from a given state duration t up to positive infinity, $$P(t)=\int_t^\infty p(t')dt'.$$

Therefore, the shortest duration on a 1-CDF plot always represents 100% of the data. The complementary CDF is calculated by counting the fraction of blinking events that are longer than a given duration t. The number of data points is therefore given by the number of blink events and the horizontal axis on the 1-CDF plot is not collected into bins. The probability distribution is the derivative of the 1-CDF and we must choose appropriate bins for it, as discussed above, in contrast to the 1-CDF.

If the probability distribution function (PDF) is a power law, $p_{pow}(t)=Ct^{-\alpha}$, where C and α are constants, then by integrating we observe that the complementary CDF $P_{pow}(t)$ must also be a power law, $$P_{pow}(t)=[C/(\alpha-1)]t^{-(\alpha-1)}.$$

On a log-log plot, this will appear as a straight line with slope 1−α. The data for QE9 and QE10, however, consistently show a nonlinear curve for the complementary CDF (FIG. 13A), indicating that there are limitations to the power law model for these probability curves.

Figures 13A, 13B:
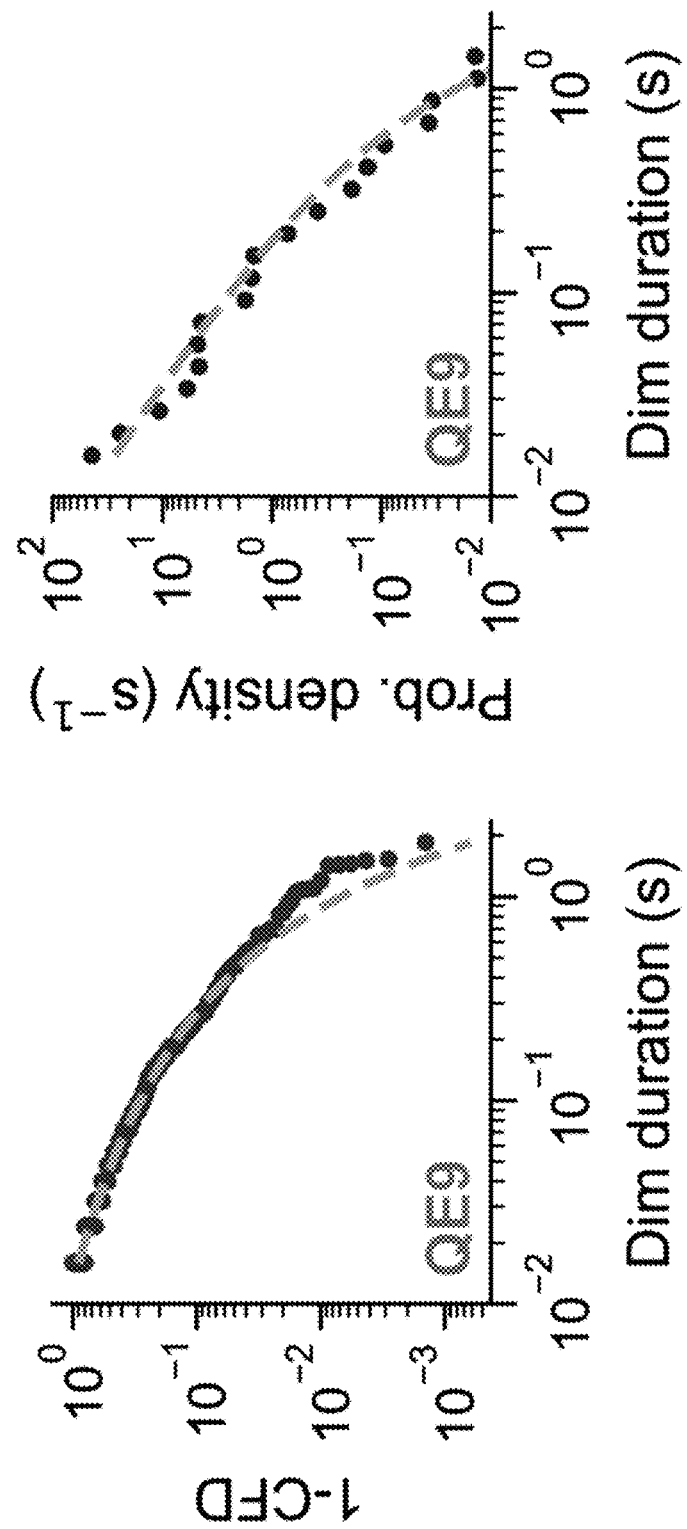
FIGS. 13A-B are graphs showing a truncated power law fit of dim state of a quantum emitter to the complementary cumulative distribution function and to a truncated power law, respectively.

FIG. 13A-B show the truncated power law fit of dim state of QE9. The fit to the complementary cumulative distribution function (1-CDF, FIG. 13A) provides fitting parameters for the probability distribution function (PDF, FIG. 13B) to fit to a truncated power law.

To better fit the data, we may, instead, model the probability distribution as a truncated power law. This is consistent with the behavior of intermittent fluorescence of quantum emitters in other systems, particularly blinking quantum dots. We now model the PDF as a truncated power law, $$p(t)=Ct^{-\alpha}\exp(t/t_c),$$

where $t_c$ is the cut-off duration time. Compared to a power law, this curve fit better matches the data trend observed in FIG. 12B and FIG. 13A. By integrating, we find the complementary CDF must then be given by $$P(t)=Ct_c^{1-\alpha}\Gamma(1-\alpha,t/t_c),$$

where Γ is the incomplete gamma function. This function is fit to the 1-CDF curves in FIG. 13A with three fitting parameters: the coefficient C, the exponent α, and the cut-off time $t_c$. By fitting to the 1-CDF instead of the PDF, we avoid artifacts that may arise from the choice of time duration bin size, which may occur for fits of the PDF, though the choice of threshold between bright and dim states may still affect the fitting parameters. The fit gives $\alpha=1.22\pm0.02$ and $t_c=0.47\pm0.03$ s. These same fitting parameters are then used to calculate the curve shown on the probability curves in FIG. 13B. While both a power law fit and a truncated power law fit are plausible models for the PDF, only the truncated power law is plausible as a fit for the 1-CDF.

CONCLUSION

FIB milling was used to generate patterned single QEs in hBN with a yield of 31%. Our FIB-based fabrication method fills in the crucial need to create and control the location of single QEs in hBN, thus enabling the integration of these QEs into chip-scale plasmonic, photonic, and optomechanical devices for quantum information applications in ambient conditions. Our technique will also provide large numbers of individually addressable single hBN QEs for QE-based sensing applications and significantly lowers the barrier for studying the physics of hBN QEs and allows for more expansive surveys of their properties.

The invention claimed is:

1. A quantum emitter device comprising: a substrate made of silicon dioxide; a layer of hexagonal boron nitride (hBN) on the substrate; and a hole milled in the layer of hBN.

2. The device of claim 1, wherein the hole milled in the layer of hBN has a side wall angle 1.1°±0.28° from the horizontal.

3. The device of claim 1, wherein the hole milled in the layer of hBN has an oval shape with minor axis 516 nm±20 nm, major axis 600 nm±20 nm.

4. The device of claim 1, wherein the hole milled in the layer of hBN has a depth 4 nm±1 nm.

5. The device of claim 1, wherein the hBN layer has a total thickness of 5-10 nm.

6. The device of claim 1, comprising multiple holes milled in the layer of hBN.

7. The device of claim 1, comprising multiple holes milled in the layer of hBN with a density of 1 hole per 1 $\mu m^2$.

8. A method of fabricating solid-state quantum emitters in 2D hexagonal boron nitride comprising providing a layer of hexagonal boron nitride (hBN) on a substrate made of silicon dioxide, and fabricating holes in the layer of hBN.

9. The method of claim 8, wherein fabricating the holes uses a gallium focused ion beam with ion dose of 10 pC/$\mu m^2$, and beam energy of 20 keV.

10. The method of claim 8, wherein fabricating the holes uses a helium focused ion beam, preferably about 100 pC/$\mu m^2$ dose at an energy of 25 keV.

11. The method of claim 8, wherein fabricating the holes uses electron beam directed etching at 25 and 15 keV and at a dose of ~1 $\mu C/\mu m^2$, performed in H2O vapor.

12. The method of claim 8, wherein fabricating the holes uses photolithography and reactive ion etch (RIE) with sidewall tapering.

13. The method of claim 8, wherein fabricating the holes uses photolithography to define array of holes with ~500 nm diameter in photoresist, performing reactive ion etching with Ar or $XeF_2$ ions.

* * * * *